United States Patent
Zhou

(10) Patent No.: US 9,984,939 B2
(45) Date of Patent: May 29, 2018

(54) WELL IMPLANTATION PROCESS FOR FINFET DEVICE

(71) Applicants: Semiconductor Manufacturing International (Beijing) Corporation, Beijing (CN); Semiconductor Manufacturing International (Shanghai) Corporation, Shanghai (CN)

(72) Inventor: Fei Zhou, Shaghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 21 days.

(21) Appl. No.: 15/283,239

(22) Filed: Sep. 30, 2016

(65) Prior Publication Data
US 2017/0154827 A1   Jun. 1, 2017

(51) Int. Cl.
H01L 21/76      (2006.01)
H01L 21/8238    (2006.01)
(Continued)

(52) U.S. Cl.
CPC .......... *H01L 21/823892* (2013.01); *H01L 21/26513* (2013.01); *H01L 21/823821* (2013.01);
(Continued)

(58) Field of Classification Search
CPC ....... H01L 21/823892; H01L 21/26513; H01L 21/823878
(Continued)

(56) References Cited

U.S. PATENT DOCUMENTS

| 9,349,658 B1* | 5/2016 | Jacob ............... H01L 21/845 |
| 2014/0117507 A1* | 5/2014 | Juengling .......... H01L 27/092 257/622 |

(Continued)

FOREIGN PATENT DOCUMENTS

| JP | 2014038898 | 2/2014 |
| KR | 20150073119 | 6/2015 |
| WO | 2014204477 | 12/2014 |

OTHER PUBLICATIONS

European Application No. 16199529.5, Extended European Search Report dated Apr. 7, 2017, 5 pages.

*Primary Examiner* — Xinning Niu
*Assistant Examiner* — Vu A Vu
(74) *Attorney, Agent, or Firm* — Kilpatrick Townsend & Stockton LLP

(57) ABSTRACT

A method for manufacturing a semiconductor device includes providing a substrate, performing an N-type dopant implantation into a first region of the substrate to form an N-well, removing a portion of the substrate to form a first set of fins on the N-well and a second set of fins on a second region of the substrate adjacent the N-well, filling gap spaces between the fins to form an isolation region, and performing a P-type dopant implantation into the second region to form a P-well adjacent the N-well. The N-well and the P-well are formed separately at different times. The loss of the P-type dopant ions due to the diffusion of P-type dopant ions in the P-well into the isolation region can be eliminated, and the damage to the fins caused by N-type dopant ions can be avoided.

13 Claims, 6 Drawing Sheets

(51) Int. Cl.
  *H01L 21/265* (2006.01)
  *H01L 21/8234* (2006.01)
  *H01L 27/092* (2006.01)
  *H01L 29/66* (2006.01)

(52) U.S. Cl.
  CPC .......... *H01L 21/823878* (2013.01); *H01L 21/823493* (2013.01); *H01L 27/0925* (2013.01); *H01L 27/0927* (2013.01); *H01L 27/0928* (2013.01); *H01L 29/66803* (2013.01)

(58) Field of Classification Search
  USPC ....................................................... 438/433
  See application file for complete search history.

(56) References Cited

U.S. PATENT DOCUMENTS

| | | |
|---|---|---|
| 2014/0264485 A1 | 9/2014 | Li et al. |
| 2015/0044829 A1 | 2/2015 | Kim et al. |
| 2015/0187634 A1* | 7/2015 | Chiang .............. H01L 21/2636 257/401 |
| 2016/0049402 A1 | 2/2016 | Liu et al. |

* cited by examiner

WELL IMPLANTATION PROCESS FOR FINFET DEVICE

CROSS-REFERENCES TO RELATED APPLICATIONS

The present application claims priority to Chinese patent application No. 201510861184.5, filed with the State Intellectual Property Office of People's Republic of China on Dec. 1, 2015, the content of which is incorporated herein by reference in its entirety.

FIELD OF THE INVENTION

The present invention relates to integrated semiconductor devices, and more particularly to methods for manufacturing a fin-type field effect transistor device.

BACKGROUND OF THE INVENTION

As the critical dimension of metal oxide semiconductor field effect transistor (MOSFET) devices continues to shrink, the short channel effect becomes more problematic. Fin field effect transistor (FinFET) devices have good control capability of gates to effectively suppress the short channel effect. FinFET devices can also reduce random dopant fluctuation to improve the stability of the devices. Thus, FinFET devices are widely used in the design of small-sized semiconductor elements.

In the manufacturing process of a FinFET device, under normal circumstances, three conditions may exist for performing a well implantation (including an N-well and a P-well): a well implant may be formed (1) before forming the fins, (2) after the planarization of the shallow trench isolation (STI) structure, or (3) after forming the fins.

In the case that the N-well and P-well are formed before the formation of the fins, because a flowable chemical vapor deposition (FCVD) process is used to fill the gap spaces between the fins with an oxide material after the fins are formed, the dopant ions, especially dopant ions implanted into the P-well may diffuse into the oxide material, resulting in the loss of the implanted dopant ions.

In the case that the N-well and P-well are formed after the planarization of the STI structure, because of the hardmask over the STI structure, the implantation of dopant ions requires a high ion energy.

In the case that the N-well and P-well are formed after the formation of the fins, the implanted dopant ions may cause damage to the fins. Especially, the N-well implant requires a relatively high ion energy that may cause severe damage to the fins.

Therefore, there is a need for improved methods for manufacturing a fin-type semiconductor device to overcome the above drawbacks.

BRIEF SUMMARY OF THE INVENTION

Embodiments of the present invention provide a method for manufacturing a semiconductor device. The method includes providing a substrate, performing an N-type dopant implantation into a first region of the substrate to form an N-well, removing a portion of the substrate to form a first set of fins on the N-well and a second set of fins on a second region of the substrate adjacent the N-well, filling gap spaces between the fins to form an isolation region, and performing a P-type dopant implantation into the second region below the second set of fins to form a P-well adjacent the N-well.

In one embodiment, the removal of the portion of the substrate may include forming a patterned hardmask on the substrate, and performing an etching process onto the substrate using the patterned hardmask as a mask to form the first set of fins on the N-well and the second set of fins on the second region adjacent the N-well.

In one embodiment, filling the gap spaces may include depositing an insulating material filling the gap spaces and covering the patterned hardmask, and planarizing the insulating material until an upper surface of the insulating material is substantially flush with a surface of the patterned hardmask.

In one embodiment, the method further includes performing an etch-back process on the planarized insulating material to expose at least the patterned hardmask, and removing the patterned hardmask.

In one embodiment, the method may further include, after forming the P-well, removing a portion of the insulation region to expose at least an upper portion of the fins.

In one embodiment, the N-type dopant implantation or the P-type dopant implantation comprises an ion implantation. The N-type dopant implantation includes arsenic or phosphorus; and the P-type dopant implantation includes boron or boron difluoride.

Embodiments of the present invention also provide another method for manufacturing a semiconductor device. The method may include providing a substrate structure containing a substrate, a plurality of fins on the substrate, an isolation region disposed between the fins, a hardmask on the fins; wherein the isolation region has an upper surface substantially flush with an upper surface of the hardmask. The method also includes performing an N-type dopant implantation into a first region of the substrate structure to form an N-well, performing an etch back process on the insulation region to expose at least the hardmask, removing the hardmask, and performing a P-type dopant implantation into a second region of the substrate structure adjacent the first region to form a P-well.

In one embodiment, the substrate structure may be obtained by the following steps: providing a substrate, forming a patterned hardmask on the substrate, removing a portion of the substrate using the patterned hardmask as a mask to form the fins, depositing an insulating material filling gap spaces between the fins and covering the patterned hardmask, and planarizing the insulating material to form the isolation region.

In one embodiment, the method may further include, after forming the P-well, removing a portion of the isolation region to expose at least an upper portion of the fins.

In one embodiment, the N-type dopant implantation or the P-type dopant implantation comprises an ion implantation. The N-type ion implantation comprises arsenic or phosphorus, and the P-type ion implantation comprises boron or boron difluoride.

The following detailed description together with the accompanying drawings will provide a better understanding of the nature and advantages of the present invention.

DETAILED DESCRIPTION OF THE INVENTION

Figure 1:
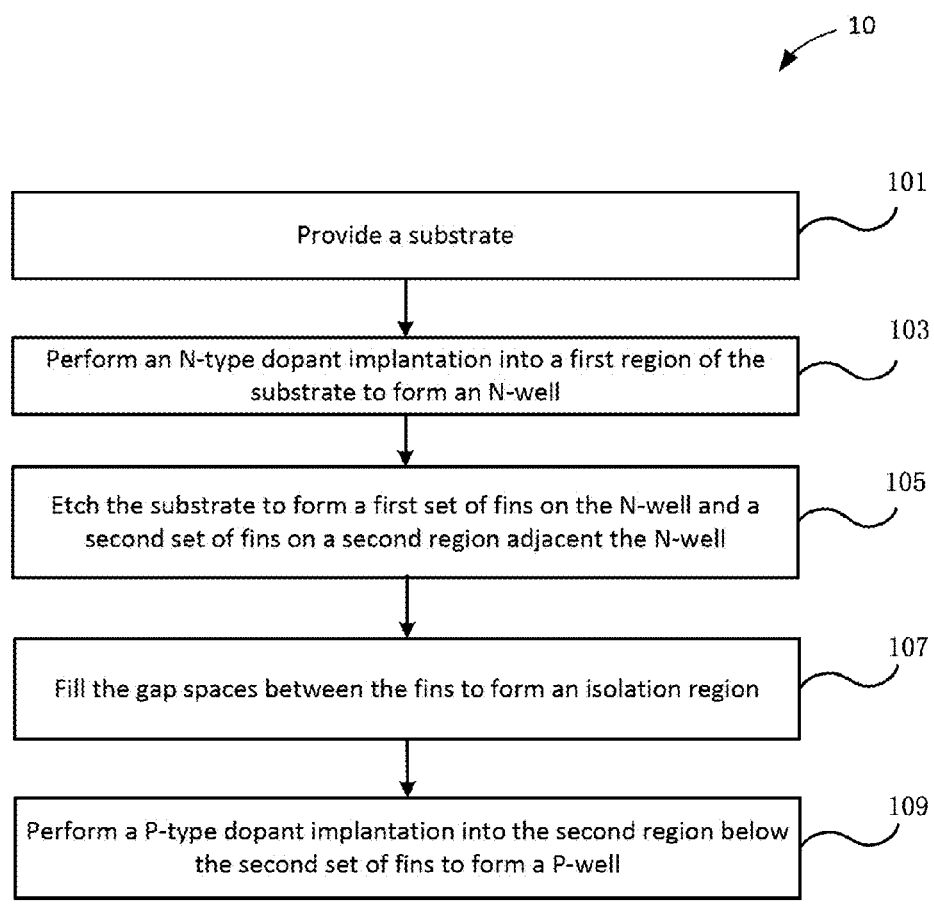
FIG. 1 is a flowchart of a method for manufacturing a semiconductor device according to an embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

FIG. 1 is a flowchart of a method for manufacturing a semiconductor device according to an embodiment of the present invention. Referring to FIG. 1, the method may include the following process steps:

At 101: providing a substrate, such as a silicon substrate or other semiconductor substrate.

At 103: performing an implant of N-type dopants into a first region of the substrate to form an N-well. For example, the N-well can be formed by means of implanting or diffusion N-type impurities into the substrate. The N-type impurities may include phosphorous ions or arsenic ions.

At 105: etching the substrate to form a first set of fins on the N-well and a second set of fins on a second region adjacent the N-well.

At 107: filling the gap spaces between the fins to form an isolation region (e.g., shallow trench isolation region).

In one case, the isolation region may completely fill the gap spaces between two adjacent fins. In another case, the isolation region may partially fill the gap spaces between two adjacent fins. Embodiments associated with these two cases will be described in detail later below.

At 109: performing an implant of P-type dopants into the second region of the substrate below the second set of fins to form a P-well adjacent the N-well. For example, the P-well can be formed by means of implanting or diffusing P-type impurities into the region of the substrate below the second set of fins. The P-type impurities may include boron ions or boron difluoride ions.

In the embodiment, the N-well and the P-well are formed separately. The N-well is first formed by means of implanting or diffusing N-type dopants into a first region of the substrate before the formation of the fins. After forming the fins, the P-well is formed by means of implanting P-type dopants into a second region of the substrate adjacent the first region. The separate formation of the N-well and P-well can, on one hand, prevent P-type dopant ions in the P-well from diffusing into the isolation region and causing loss of the P-type dopant ions, and on another hand, N-type dopant ions from causing damage to the fins.

It is noted that, as used herein, unless specifically stated otherwise, the terms "substantially fill" and "substantially filling" refer to filling completely the gap spaces within the process variation tolerance. The terms "substantially coplanar" and "substantially flush" refer to surfaces that are sufficiently coplanar or flush within the process variation tolerance.

FIGS. 2 through 10 are cross-sectional views illustrating intermediate stages of a method for manufacturing a semiconductor device according to the present invention.

Figure 2:
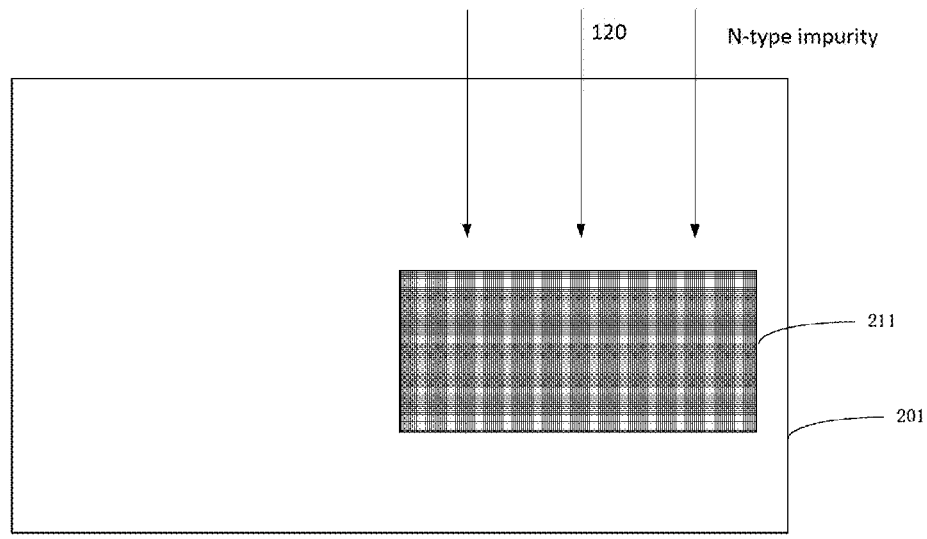
FIG. 2 is a cross-sectional view illustrating an intermediate stage of a manufacturing method according to the present invention.

Referring to FIG. 2, a substrate 201 is provided. An implantation of an N-type doping material 120 is performed into a region of the substrate to form an N-well 211. For example, arsenic ions or phosphorus ions can be implanted into a region of the substrate by way of ion implantation, the N-well 211 can be formed by controlling the depth and the concentration of the implanted impurities. Herein, a pad oxide layer (not shown) may be formed on the substrate 201 in order to reduce damage caused by the ion implantation. Furthermore, after performing the implantation, an annealing process may be carried out, e.g., a rapid thermal anneal (RTA) process, to activate the implanted impurities or dopants.

Figure 3:
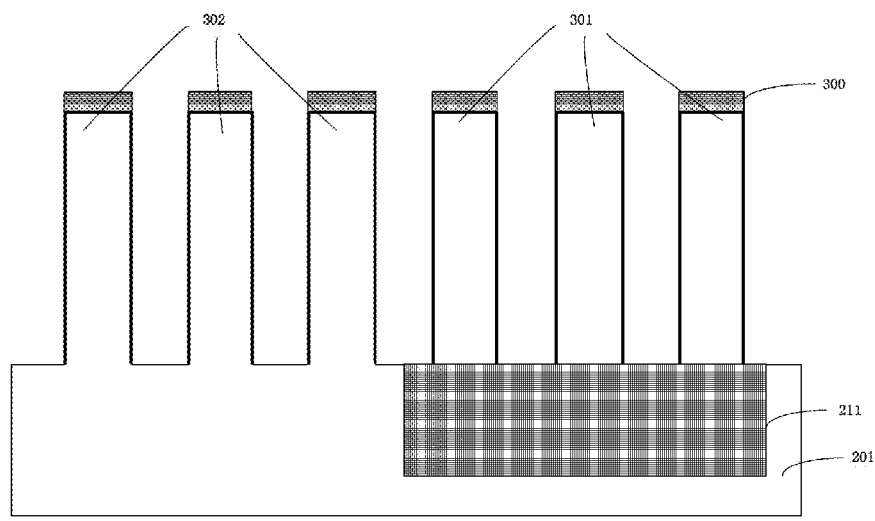
FIG. 3 is a cross-sectional view illustrating an intermediate stage of a manufacturing method according to the present invention.

Next, referring to FIG. 3, a patterned hardmask 300 is formed on the substrate 201. The patterned hardmask 300 may be silicon oxide, silicon oxynitride, or the like. The substrate 201 is then etched using the patterned hardmask 300 as a mask to form a first set of fins 301 on the N-well 211 and a second set of fins 302 on a region of the substrate adjacent the N-well. In some embodiments, the first set of fins 301 and the region adjacent to the N-well 211 may also include a portion of an N-type doped region, i.e., a portion of the N-well 211 may also be etched away during the etching of the substrate.

Figure 4:
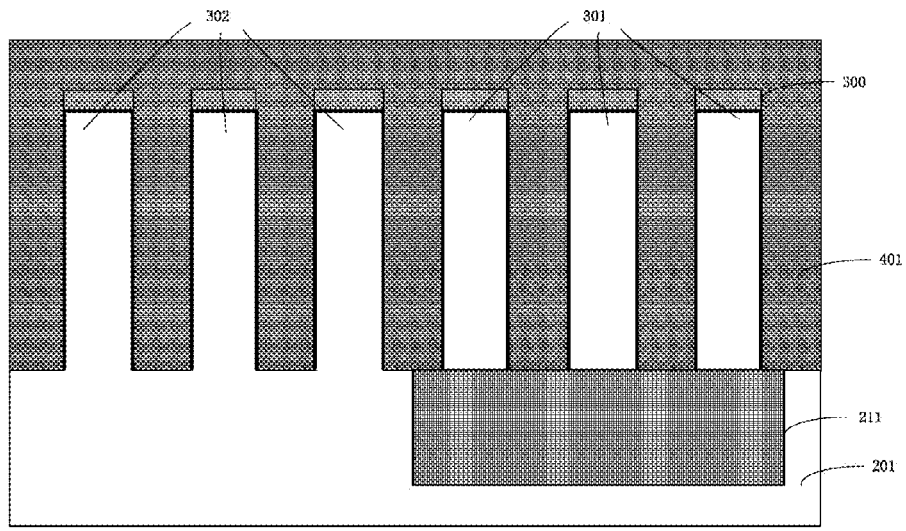
FIG. 4 is a cross-sectional view illustrating an intermediate stage of a manufacturing method according to the present invention.

Next, referring to FIG. 4, the gap spaces between the fins 301, 302 are filled with an insulating material 401, which also covers the patterned hardmask 300. For example, the insulating material 401 may be deposited by a flowable chemical vapor deposition (FCVD) process to fill the gap spaces between the fins and cover the fins. The insulating material 401 may include a dielectric material.

Figure 5:
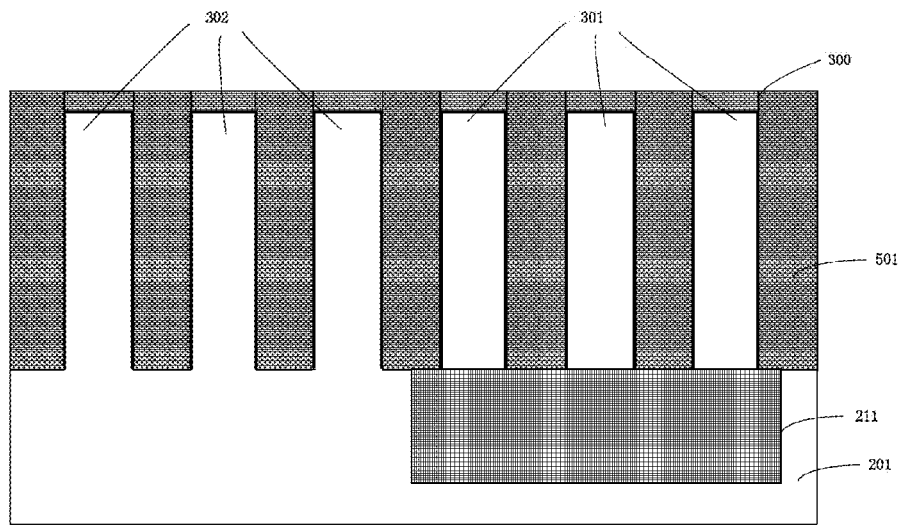
FIG. 5 is a cross-sectional view illustrating an intermediate stage of a manufacturing method according to the present invention.

Thereafter, referring to FIG. 5, a planarization (e.g., a chemical mechanical polishing) process is performed on the insulating material 401 such that the upper surface of the insulating material 401 is substantially flush (coplanar) with the upper surface of the patterned hardmask, thereby forming an isolation region 501 between two adjacent fins. The isolation region 501 substantially fills the gap spaces between the fins.

Figure 6:
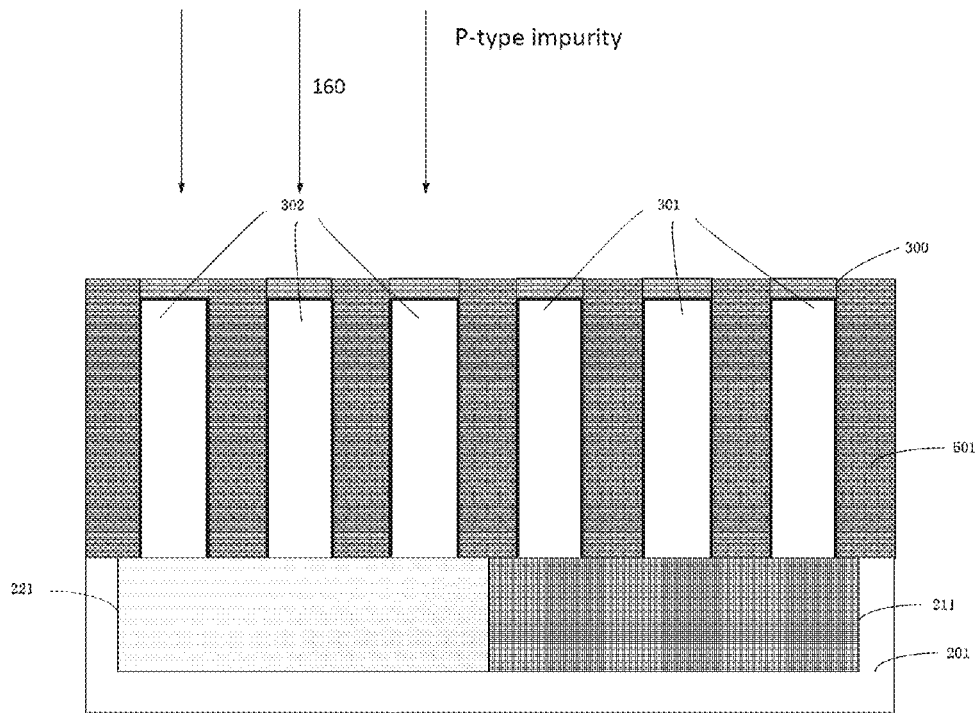
FIG. 6 is a cross-sectional view illustrating an intermediate stage of a manufacturing method according to the present invention.

Next, referring to FIG. 6, an implantation 160 of a P-type doping material is performed into a region of the substrate below the second set of fins 302 to form a P-well 221 adjacent the N-well 211. For example, boron ions or boron difluoride ions can be implanted into the substrate 201 to form the P-well 221. If the P-type implantation is by means of an ion implantation process, it will require larger implantation energies due to the presence of the hardmask.

Figure 7:
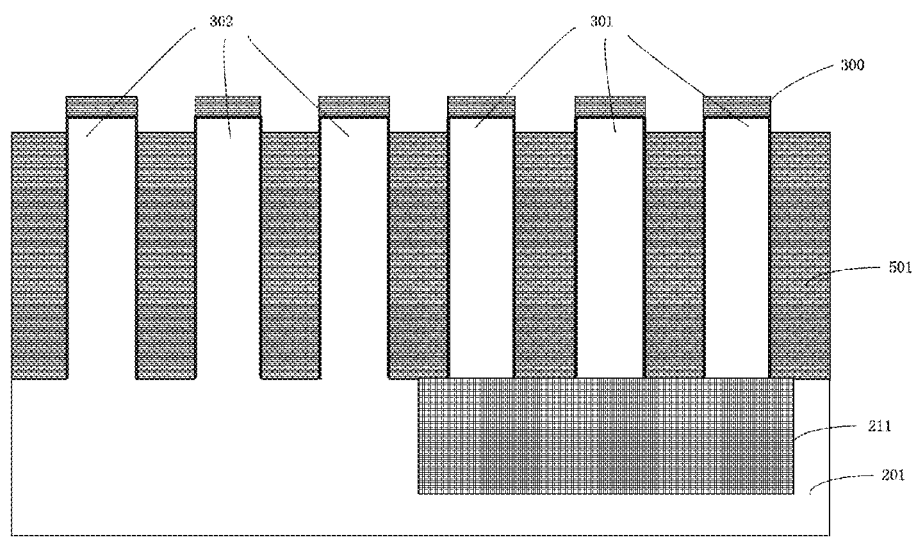
FIG. 7 is a cross-sectional view illustrating an intermediate stage of a manufacturing method according to the present invention.

In alternative embodiments, after the planarization of the insulating material as shown in FIG. 5, the insulating material 401 may be etched back to expose at least the hardmask 300, as shown in FIG. 7. In one embodiment, only the hardmask 300 is exposed without exposing the individual fins. In another embodiment, a top portion of the fins may also be exposed. FIG. 7 is a cross-sectional view illustrating that the hardmask 300 and a top portion of the fins are exposed. It is noted that FIG. 7 follows FIG. 5. That is, the implantation 160 of a P-type doping material as shown in FIG. 6 has not been performed in FIG. 7. In other words, the P-well has not been formed.

Figure 8:
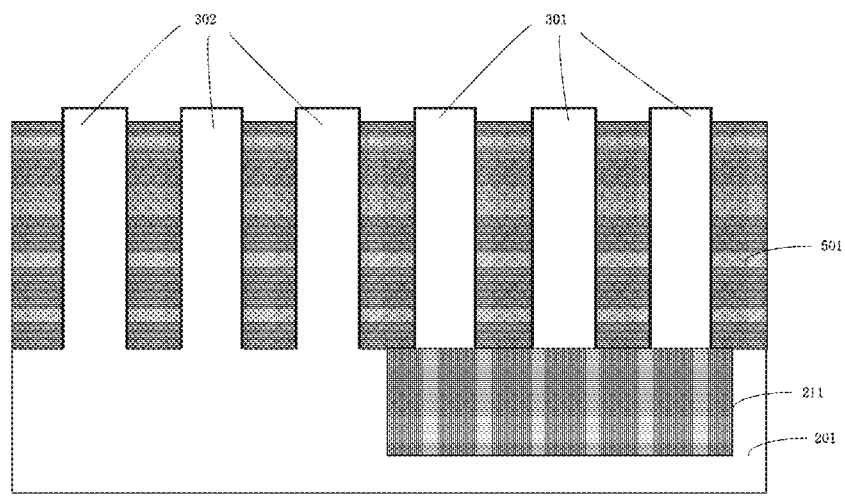
FIG. 8 is a cross-sectional view illustrating an intermediate stage of a manufacturing method according to the present invention.

Next, referring to FIG. 8, the hardmask 300 is removed. The isolation region 501 fills the gap spaces between the fins.

Figure 9:
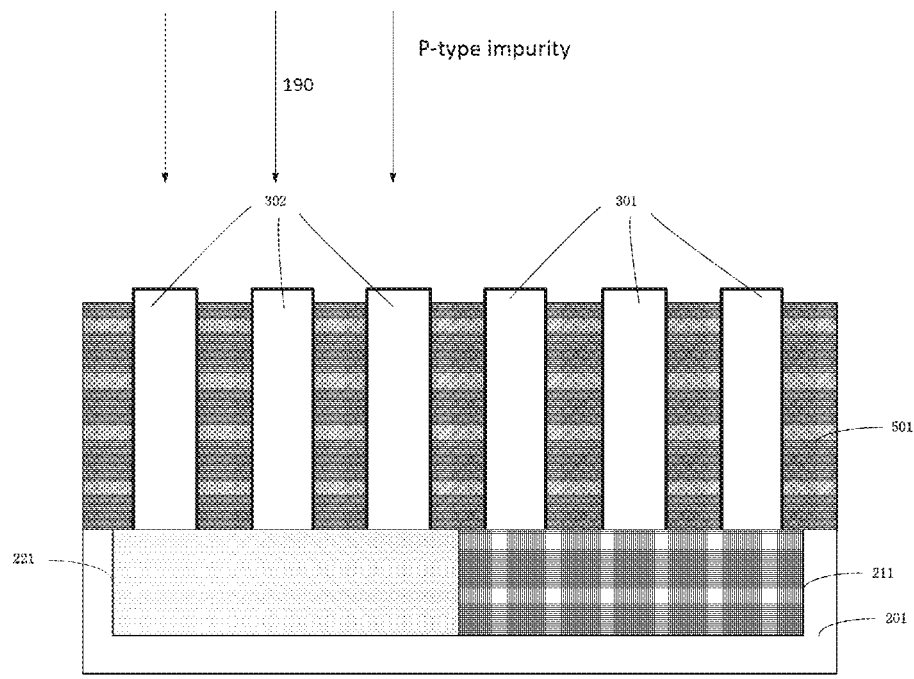
FIG. 9 is a cross-sectional view illustrating an intermediate stage of a manufacturing method according to the present invention.

Next, referring to FIG. 9, an implantation 190 of a P-type doping material is performed into the region of the substrate below the second set of fins to form a P-well 221 adjacent the N-well. The implantation 190 may be performed with lower energy than the implantation 160 due to the removed hardmask. An annealing treatment, such as a rapid thermal annealing (RTA) process, can be performed to activate the implanted P-type dopants or impurities. It is to be understood that, in the dopant implantation and/or annealing processes, the doped impurities may be implanted or diffused into a portion of the fins 302, so that the formed P-well 221 may also include a portion of the fins 302.

Figure 10:
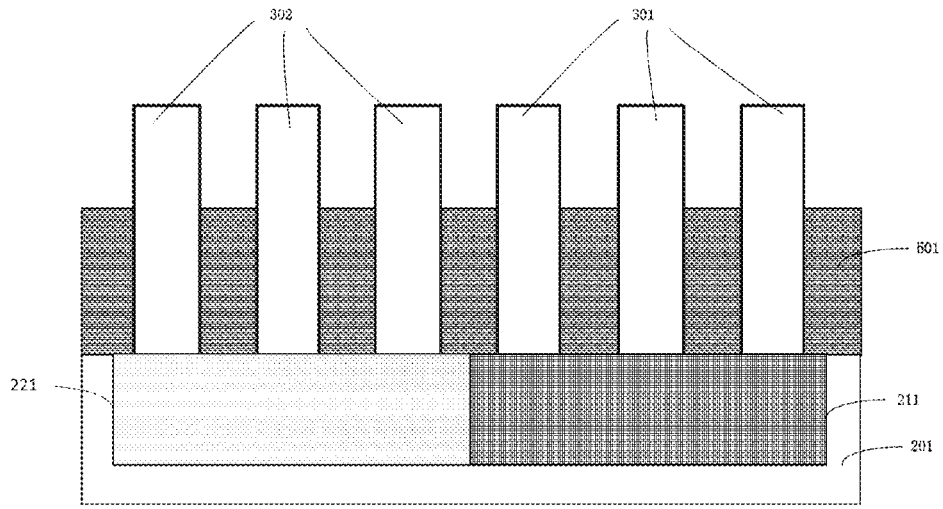
FIG. 10 is a cross-sectional view illustrating an intermediate stage of a manufacturing method according to the present invention.

Next, referring to FIG. 10, after the formation of the P-well 221, a portion of the insulation region 501 is removed to expose at least an upper portion of the fins, so that the upper surface of the isolation region 501 is below the upper surface of the fins extends. In other words, the fins protrude above the upper surface of the insulation region 501 to a desired height. It is to be understood, however, that this process step is optional. In some embodiments, the insulating material 401 may be etched back so that the upper surface of the fins protrude above the upper surface of isolation region 501 to the desired height.

Thereafter, an ion implantation process may be performed into the exposed portions of the fins to adjust the threshold voltage, and an annealing process is performed after the ion implantation. Other processes that follow may not be the key aspects of the present invention, and thus will not be described further herein.

Figure 11:
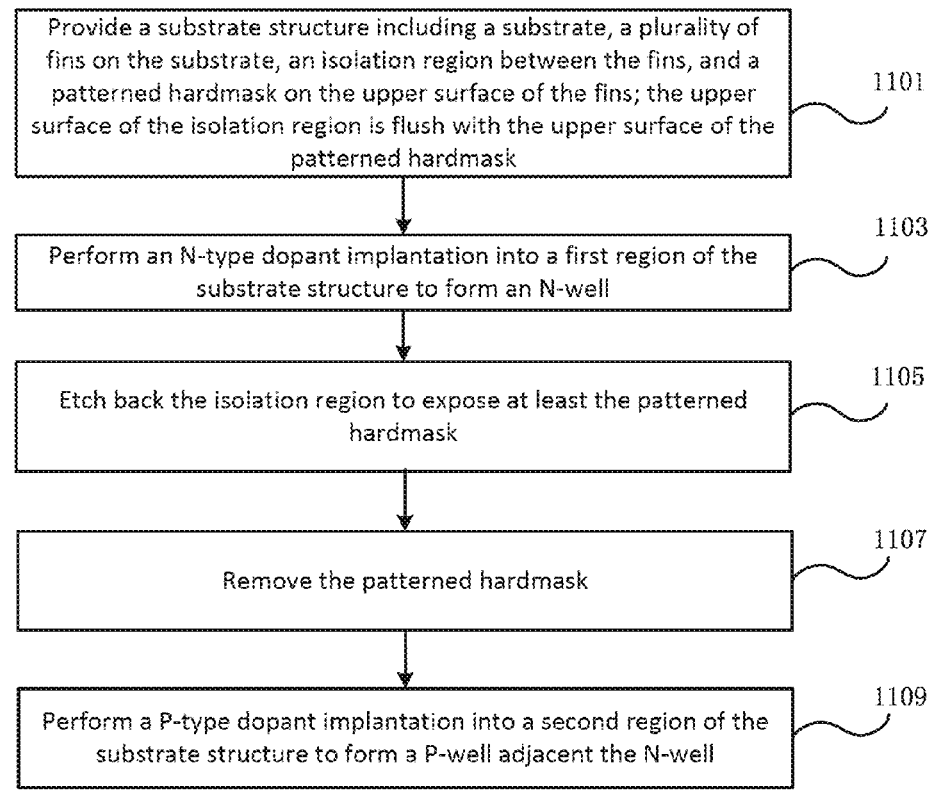
FIG. 11 is a flowchart of a method for manufacturing a semiconductor device according to another embodiment of the present invention.

FIG. 11 is a flowchart of a method 11 for manufacturing a semiconductor device according to another embodiment of the present invention. Referring to FIG. 11, the method may include the following process steps:

At 1101: providing a substrate structure. The substrate includes a substrate, a plurality of fins on the substrate, an isolation region disposed between the fins, and a patterned hard mask disposed on the upper surface of the fins. The upper surface of the isolation region is flush with the top surface of the hardmask. Referring to FIG. 5, a substrate 201 is provided, multiple fins 301, 302 are disposed on the substrate 201, a patterned hardmask 300 is disposed on the fins 301, 302, and an isolation region 501 is disposed between the fins and has an upper surface flush with the upper surface of the hardmask 300.

At 1103: an implantation of an N-type doping material is performed into a first region of the substrate structure to form an N-well. The implantation may be performed by way of ion implantation or diffusion. The doping material may be arsenic ions or phosphorus ions. Referring still to FIG. 5, an N-well 211 is formed in the substrate 201.

At 1105: the isolation region is etched back to expose at least the hardmask on the fins. Referring to FIG. 7, the hardmask 300 is exposed after etching back a portion of the isolation region 501.

At 1107: the patterned hardmask is removed. FIG. 8 shows that the patterned hardmask 300 has been removed.

At 1109: an implantation of a P-type doping material is performed into a second region of the substrate structure adjacent the first region to form a P-well. The P-type material may include boron or boron difluoride. Referring to FIG. 9, a P-well 221 is formed adjacent the N-well 211.

According to the present invention, the N-well and the P-well are formed separately at different times. Comparing to the method 10 of FIG. 1, in the method 11 the N-type dopant implantation is performed to form an N-well prior to removing the patterned hardmask, the P-type dopant implantation is performed to form a P-well after the formation of the fins. Similar to the method 10 shown in FIG. 1, the method 11 can also obtain the following effects: on one hand, the loss of the P-type dopant ions due to the diffusion of P-type dopant ions in the P-well into the isolation region can be avoided, and on another hand, the damage to the fins caused by N-type dopant ions can also be prevented.

The substrate structure at step 1101 can be characterized by the following sequence: a substrate is provided, a patterned hardmask is formed on the substrate, the substrate is etched using the hardmask as a mask to form a plurality of fins, an insulating material is filled into the gap spaces between the fins and covering the patterned hardmask, the insulating material is then planarized to form an isolation region.

In an embodiment, the method 11 may also include, after forming the P-well, removing a portion of the isolation region to expose at least an upper portion of the fins so that the upper surface of the isolation region is below the upper surface of the fins by a predetermined distance. In other words, the top surface of the fins is at a predetermined height from the upper surface of the isolation region.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a semiconductor device, the method comprising:
   providing a substrate;
   performing an N-type dopant implantation into a first region of the substrate to form an N-well;
   after forming the N-well, removing a portion of the substrate to form a first set of fins on the N-well and a second set of fins on a second region of the substrate laterally adjacent the N-well;
   filling gap spaces between the fins to form an isolation region; and
   performing a P-type dopant implantation into the second region below the second set of fins to form a P-well laterally adjacent the N-well.

2. The method of claim 1, wherein removing the portion of the substrate comprises:
   forming a patterned hardmask on the substrate;
   performing an etching process onto the substrate using the patterned hardmask as a mask to form the first set of fins on the N-well and the second set of fins on the second region adjacent the N-well.

3. The method of claim 2, wherein filling the gap spaces comprises:
   depositing an insulating material filling the gap spaces and covering the patterned hardmask;
   planarizing the insulating material until an upper surface of the insulating material is substantially flush with a surface of the patterned hardmask.

4. The method of claim 3, further comprising:
   performing an etch-back process on the planarized insulating material to expose at least the patterned hardmask;
   removing the patterned hardmask.

5. The method of claim 4, further comprising, after forming the P-well:
   removing a portion of the insulation region to expose at least an upper portion of the fins.

6. The method of claim 1, further comprising, after forming the P-well:
   removing a portion of the insulation region to expose at least an upper portion of the fins.

7. The method of claim 1, wherein the N-type dopant implantation or the P-type dopant implantation comprises an ion implantation.

8. The method of claim 1, wherein the N-type dopant implantation comprises arsenic or phosphorus; and the P-type dopant implantation comprises boron or boron difluoride.

9. A method for manufacturing a semiconductor device, the method comprising:
   providing a substrate structure including a substrate, a plurality of fins on the substrate, an isolation region disposed between the fins, a hardmask on the fins, wherein the isolation region has an upper surface substantially flush with an upper surface of the hardmask;
   performing an N-type dopant implantation into a first region of the substrate structure to form an N-well;
   performing an etch back process on the insulation region to expose at least the hardmask;
   removing the hardmask; and
   performing a P-type dopant implantation only into a second region of the substrate structure adjacent the first region to form a P-well.

10. The method of claim 9, wherein providing the substrate structure comprises:
    providing a substrate;
    forming a patterned hardmask on the substrate;
    removing a portion of the substrate using the patterned hardmask as a mask to form the fins;
    depositing an insulating material filling gap spaces between the fins and covering the patterned hardmask;
    planarizing the insulating material to form the isolation region.

11. The method of claim 9, further comprising, after forming the P-well:
    removing a portion of the isolation region to expose at least an upper portion of the fins.

12. The method of claim 9, wherein the N-type dopant implantation or the P-type dopant implantation comprises an ion implantation.

13. The method of claim 9, wherein the N-type dopant implantation comprises arsenic or phosphorus; and the P-type dopant implantation comprises boron or boron difluoride.

* * * * *